United States Patent
Chang et al.

(10) Patent No.: US 10,714,301 B1
(45) Date of Patent: Jul. 14, 2020

(54) CONDUCTIVE BEAM OPTICS FOR REDUCING PARTICLES IN ION IMPLANTER

(71) Applicant: Varian Semiconductor Equipment Associates, Inc., Gloucester, MA (US)

(72) Inventors: Shengwu Chang, South Hamilton, MA (US); Frank Sinclair, Boston, MA (US); Alexandre Likhanskii, Malden, MA (US); Christopher Campbell, Newburyport, MA (US); Robert C. Lindberg, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 111 days.

(21) Appl. No.: 15/901,775

(22) Filed: Feb. 21, 2018

(51) Int. Cl.
  *H01J 37/05* (2006.01)
  *H01J 37/31* (2006.01)
  *H01J 37/317* (2006.01)

(52) U.S. Cl.
  CPC .......... *H01J 37/05* (2013.01); *H01J 37/3171* (2013.01); *H01J 2237/057* (2013.01)

(58) Field of Classification Search
  CPC ............. H01J 37/3171; H01J 2237/022; H01J 27/024; H01J 37/3002; H01J 2237/31705; H01J 49/26
  USPC .................. 250/492.21, 423 R, 396 R, 492.3
  See application file for complete search history.

(56) References Cited

U.S. PATENT DOCUMENTS

| | | | | |
|---|---|---|---|---|
| 4,687,939 A | * | 8/1987 | Miyauchi | C23C 14/221 118/723 CB |
| 5,134,301 A | * | 7/1992 | Kamata | H01J 27/26 250/492.2 |
| 5,189,303 A | * | 2/1993 | Tanjyo | H01J 27/024 250/296 |

(Continued)

FOREIGN PATENT DOCUMENTS

| | | |
|---|---|---|
| EP | 1314181 A2 | 5/2003 |
| JP | 2015-191740 A | 11/2015 |
| WO | 2014-022045 A1 | 2/2014 |

OTHER PUBLICATIONS

International Search Report and Written Opinion dated May 8, 2019 for PCT Application, PCT/US2019/014536 filed Jan. 22, 2019.

(Continued)

*Primary Examiner* — David A Vanore

(57) ABSTRACT

Provided herein are approaches for reducing particles in an ion implanter. An electrostatic filter may include a housing and a plurality of conductive beam optics within the housing. The conductive beam optics are arranged around an ion beam-line directed towards a wafer, and may include entrance aperture electrodes proximate an entrance aperture of the housing. The conductive beam optics may further include energetic electrodes downstream along the ion beam-line from the entrance aperture electrodes, and ground electrodes downstream from the energetic electrodes. The energetic electrodes are positioned farther away from the ion beam-line than the entrance electrodes and the ground electrodes, thus causing the energetic electrodes to be physically blocked from impact by an envelope of back-sputter material returning from the wafer. The electrostatic filter may further include an electrical system for independently delivering a voltage and a current to each of the conductive beam optics.

18 Claims, 8 Drawing Sheets

(56) References Cited

U.S. PATENT DOCUMENTS

| | | | | |
|---|---|---|---|---|
| 5,391,962 | A * | 2/1995 | Roberts | H01J 27/028 250/427 |
| 5,504,340 | A * | 4/1996 | Mizumura | H01J 37/3056 250/423 R |
| 6,486,478 | B1 * | 11/2002 | Libby | H01J 37/3053 204/192.1 |
| 7,767,977 | B1 * | 8/2010 | Godet | H01J 27/024 250/423 R |
| 8,124,946 | B2 * | 2/2012 | Ryding | H01J 37/05 250/281 |
| 9,142,379 | B2 * | 9/2015 | Koo | H01J 27/02 |
| 9,293,295 | B2 * | 3/2016 | Yagita | H01J 37/147 |
| 9,685,298 | B1 | 6/2017 | Likhanskii et al. | |
| 9,916,966 | B1 * | 3/2018 | Buonodono | H01J 37/242 |
| 2007/0194252 | A1 * | 8/2007 | Horsky | H01J 37/08 250/492.21 |
| 2008/0237496 | A1 * | 10/2008 | Gupta | H01J 37/08 250/492.21 |
| 2009/0236547 | A1 * | 9/2009 | Huang | H01J 37/20 250/492.21 |
| 2010/0107980 | A1 | 5/2010 | Horsky et al. | |
| 2011/0186749 | A1 * | 8/2011 | Godet | H01J 27/08 250/424 |
| 2014/0041684 | A1 * | 2/2014 | Kurunczi | B08B 7/0021 134/1.1 |
| 2014/0086376 | A1 * | 3/2014 | Perkins | H05H 3/06 376/114 |
| 2014/0150723 | A1 * | 6/2014 | Kabasawa | H01J 37/32412 118/723 R |
| 2014/0374617 | A1 * | 12/2014 | Kabasawa | H01J 37/05 250/396 R |
| 2015/0129775 | A1 * | 5/2015 | Sato | H01J 27/08 250/424 |
| 2015/0136996 | A1 * | 5/2015 | Inada | H01J 37/3171 250/396 R |
| 2015/0228454 | A1 * | 8/2015 | Kato | H01J 37/3171 250/396 ML |
| 2015/0380206 | A1 | 12/2015 | White et al. | |
| 2016/0013014 | A1 * | 1/2016 | Kagawa | H01J 37/3171 250/396 R |
| 2016/0042915 | A1 * | 2/2016 | Sano | H01J 37/244 250/492.3 |
| 2016/0111250 | A1 * | 4/2016 | Sato | H01J 37/08 313/153 |
| 2016/0163527 | A1 * | 6/2016 | Sekimoto | H01J 49/142 250/288 |
| 2017/0032924 | A1 | 2/2017 | Lee et al. | |
| 2017/0243730 | A1 * | 8/2017 | Takahashi | H01J 37/3171 |
| 2018/0011057 | A1 * | 1/2018 | Nishiguchi | G01N 27/622 |
| 2018/0218894 | A1 * | 8/2018 | Likhanskii | H01J 49/22 |
| 2018/0254166 | A1 * | 9/2018 | Kawaguchi | H01J 27/205 |

OTHER PUBLICATIONS

International Search Report and Written Opinion dated May 9, 2019 for PCT Application, 014541 filed Jan. 22, 2019.

* cited by examiner

CONDUCTIVE BEAM OPTICS FOR REDUCING PARTICLES IN ION IMPLANTER

FIELD OF THE DISCLOSURE

The disclosure relates generally to ion implanters, and more particularly, to conductive beam optics for improving the performance and extending the lifetime of components within a processing chamber by reducing particle accumulation.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties. For example, dopants may be introduced into an intrinsic semiconductor substrate to alter the type and level of conductivity of the substrate. In manufacturing an integrated circuit (IC), a precise doping profile provides improved IC performance. To achieve a desired doping profile, one or more dopants may be implanted in the form of ions in various doses and various energy levels.

Ion implantation systems may comprise an ion source and a series of beam-line components. The ion source may comprise a chamber where desired ions are generated. The ion source may also comprise a power source and an extraction electrode assembly disposed near the chamber. The beam-line components may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having desired species, shape, energy, and other qualities. The ion beam passes through the beam-line components and may be directed toward a substrate or wafer mounted on a platen or clamp. The substrate may be moved in one or more dimensions (e.g., translate, rotate, and tilt) by an apparatus, sometimes referred to as a roplat.

The ion implanter generates a stable, well-defined ion beam for a variety of different ion species and extraction voltages. After several hours of operation using source gases (such as $AsH_3$, $PH_3$, $BF_3$, and other species), beam constituents eventually create deposits on the beam optics. Beam optics within a line-of-sight of the wafer also become coated with residues from the wafer, including Si and photoresist compounds. These residues build up on the beam-line components, causing spikes in the DC potentials during operation (e.g., in the case of electrically biased components). Eventually the residues flake off, causing an increased likelihood of particulate contamination on the wafer.

One way to prevent the effect of the material accumulation is to intermittently replace beam-line components of the ion implanter system. Alternatively, beam-line components may be manually cleaned, including powering down the ion source, and releasing the vacuum within the system. After replacing or cleaning the beam-line components, the system is then evacuated and powered to reach an operational condition. Accordingly, these maintenance processes may be very time consuming. In addition, the beam-line component is not used during the maintenance processes. As such, frequent maintenance processes may decrease the time available for IC production, thus increasing overall manufacturing cost.

SUMMARY

In view of the foregoing, provided herein are systems and methods for configuring a plurality of conductive beam optics within an energy purity module (EPM) to reduce particle build-up within the EPM. In one or more embodiments, an ion implantation system includes an electrostatic filter for delivering an ion beam to a wafer. The electrostatic filter may include a housing having an exit proximate the wafer, and a plurality of conductive beam optics within the housing. The plurality of conductive beam optics is arranged around an ion beam-line. The plurality of conductive beam optics may include a set of entrance aperture electrodes proximate an entrance aperture of the housing, and a set of energetic electrodes downstream along the ion beam-line from the set of entrance aperture electrodes. The plurality of conductive beam optics may further include a set of ground electrodes downstream along the ion beam-line of the set of energetic electrodes, where the set of energetic electrodes may be positioned farther away from the ion beam-line than the set of entrance aperture electrodes and the set of ground electrodes. The ion implantation system may further include an electrical system in communication with the electrostatic filter, the electrical system operable to supply a voltage and a current to the plurality of conductive beam optics.

In one or more embodiments, an energy purity module (EPM) for delivering an ion beam to a workpiece may include a housing having an exit proximate the wafer, and a plurality of conductive beam optics within the housing. The plurality of conductive beam optics may include a set of entrance aperture electrodes proximate an entrance aperture of the housing, and a set of energetic electrodes downstream along the ion beam-line from the set of entrance aperture electrodes. The plurality of conductive beam optics may further include a set of ground electrodes downstream along the ion beam-line of the set of energetic electrodes, wherein the set of energetic electrodes is positioned farther away from the ion beam-line than the set of entrance aperture electrodes and the set of ground electrodes. The EPM may further include an electrical system in communication with the plurality of conductive beam optics, the electrical system operable to independently supply a voltage and a current to each of the plurality of conductive beam optics.

In one or more embodiments, a method for minimizing particles in an ion implantation system may include arranging a plurality of conductive beam optics arranged around an ion beam-line. The plurality of conductive beam optics may include a set of entrance aperture electrodes disposed proximate an entrance aperture of the housing, and a set of energetic electrodes disposed downstream along the ion beam-line from the set of entrance aperture electrodes. The plurality of conductive beam optics may further include a set of ground electrodes disposed downstream along the ion beam-line of the set of energetic electrodes, wherein the set of energetic electrodes is positioned farther away from the ion beam-line than the set of entrance aperture electrodes and the set of ground electrodes. The method may further include enabling an electrical system to independently supply a voltage and a current to each of the plurality of conductive beam optics.

Figure 1:
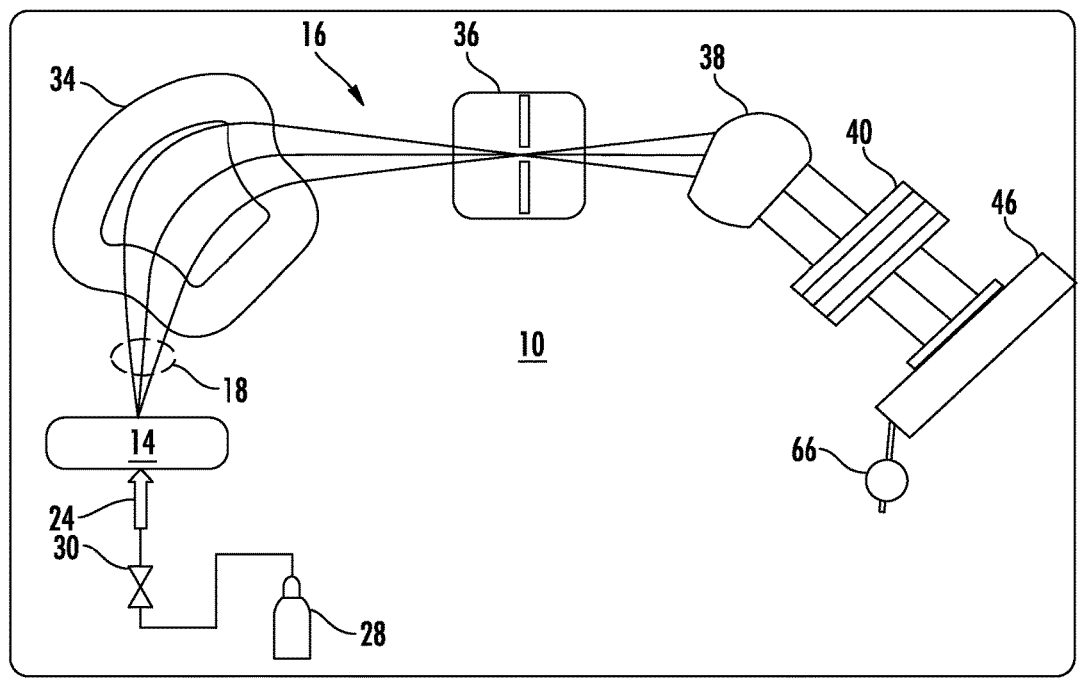
FIG. 1 is a schematic view illustrating an ion implantation system in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements. Furthermore, certain elements in some of the figures may be omitted, or illustrated not-to-scale, for illustrative clarity. Still furthermore, for clarity, some reference numbers may be omitted in certain drawings.

DETAILED DESCRIPTION

A system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so the disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of various components and their constituent parts, as appearing in the figures. The terminology will include the words specifically mentioned, derivatives thereof, and words of similar import.

As used herein, an element or operation recited in the singular and proceeded with the word "a" or "an" are understood as not excluding plural elements or operations, until such exclusion is explicitly recited. Furthermore, references to "one embodiment" of the present disclosure are not intended to be interpreted as excluding the existence of additional embodiments also incorporating the recited features.

Provided herein are approaches for reducing particles in an ion implanter. An electrostatic filter may include a housing and a plurality of conductive beam optics within the housing. The conductive beam optics are arranged around an ion beam-line directed towards a wafer, and may include entrance aperture electrodes proximate an entrance aperture of the housing. The conductive beam optics may further include energetic electrodes downstream along the ion beam-line from the entrance aperture electrodes, and ground electrodes downstream from the energetic electrodes. The energetic electrodes are positioned farther away from the ion beam-line than the entrance electrodes and the ground electrodes, thus causing the energetic electrodes to be physically blocked or shielded from being coated by an envelope of back-sputter material returning from the wafer. The electrostatic filter may further include an electrical system for delivering a voltage and a current to each of the conductive beam optics.

The electrostatic filter may be an energy purity module having a plurality of energetic electrodes "hidden" behind the ground electrodes so the back-sputter material is less likely to reach the energetic electrodes. In some embodiments, one or more conductive beam optics of the EPM include an internal heating element operable to raise a temperature thereof. In situ cleaning and chemical etch from a gas bleed within the EPM keeps the energetic electrodes and apertures free from the deposition of the back-sputter materials. As a result, performance and accuracy of the ion implanter is improved.

Referring now to FIG. 1, shown is an exemplary embodiment demonstrating an ion implanter or ion implantation system (hereinafter "system") 10 for delivering an ion beam to a wafer or workpiece, and for performing in-situ plasma cleaning of one or more components, such as conductive beam optics within an electrostatic filter. The system 10 represents a process chamber containing, among other components, an ion source 14 for producing an ion beam 18, an ion implanter, and a series of beam-line components. The ion source 14 may comprise a chamber for receiving a flow of gas 24 and generates ions. The ion source 14 may also comprise a power source and an extraction electrode assembly disposed near the chamber. The beam-line components 16 may include, for example, a mass analyzer 34, a first acceleration or deceleration stage 36, a collimator 38, and an energy purity module (EPM) 40 corresponding to a second acceleration or deceleration stage. Although described hereinafter with respect to the EPM 40 of the beam-line components 16 for the sake of explanation, the embodiments described herein for in-situ plasma cleaning are also applicable to different/additional components of the system 10.

In exemplary embodiments, the beam-line components 16 may filter, focus, and manipulate ions or the ion beam 18 to have a desired species, shape, energy, and other qualities. The ion beam 18 passing through the beam-line components 16 may be directed toward a substrate mounted on a platen or clamp within a process chamber 46. The substrate may be moved in one or more dimensions (e.g., translate, rotate, and tilt). The ion beam 18 travels along an ion beam-line corresponding to an approximate center of the ion beam 18 shown.

As shown, there may be one or more feed sources 28 operable with the chamber of the ion source 14. In some embodiments, material provided from the feed source 28 may include source material and/or additional material. The source material may contain dopant species introduced into the substrate in the form of ions. Meanwhile, the additional material may include diluent, introduced into the ion source chamber of the ion source 14 along with the source material to dilute the concentration of the source material in the chamber of the ion source 14. The additional material may also include a cleaning agent (e.g., an etchant gas) introduced into the chamber of the ion source 14 and transported within the system 10 to clean one or more of the beam-line components 16.

In various embodiments, different species may be used as the source and/or the additional material. Examples of the source and/or additional material may include atomic or molecular species containing boron (B), carbon (C), oxygen (O), germanium (Ge), phosphorus (P), arsenic (As), silicon (Si), helium (He), neon (Ne), argon (Ar), krypton (Kr), nitrogen (N), hydrogen (H), fluorine (F), and chlorine (Cl). Those of ordinary skill in the art will recognize the above listed species are non-limiting, and other atomic or molecular species may also be used. Depending on the application(s), the species may be used as the dopants or the additional material. In particular, one species used as the dopants in one application may be used as the additional material in another application, or vice-versa.

In exemplary embodiments, the source and/or additional material is provided into the ion source chamber of the ion source 14 in gaseous or vapor form. If the source and/or additional material is in non-gaseous or non-vapor form, a vaporizer (not shown) may be provided near the feed source 28 to convert the material into gaseous or vapor form. To control the amount and the rate the source and/or the additional material is provided into the system 10, a flowrate controller 30 may be provided.

The EPM 40 is a beam-line component operable to independently control deflection, deceleration, and focus of the ion beam 18. In one embodiment, the EPM 40 is a vertical electrostatic energy filter (VEEF) or electrostatic filter (EF). As will be described in greater detail below, the EPM 40 may include an electrode configuration comprising a set of upper electrodes disposed above the ion beam 18 and a set of lower electrodes disposed below the ion beam 18. The set of upper electrodes and the set of lower electrodes may be stationary and have fixed positions. A difference in potentials between the set of upper electrodes and the set of lower electrodes may also be varied along the central ion beam trajectory to reflect an energy of the ion beam at each point along the central ion beam trajectory for independently controlling deflection, deceleration, and/or focus of an ion beam.

Figure 2A:
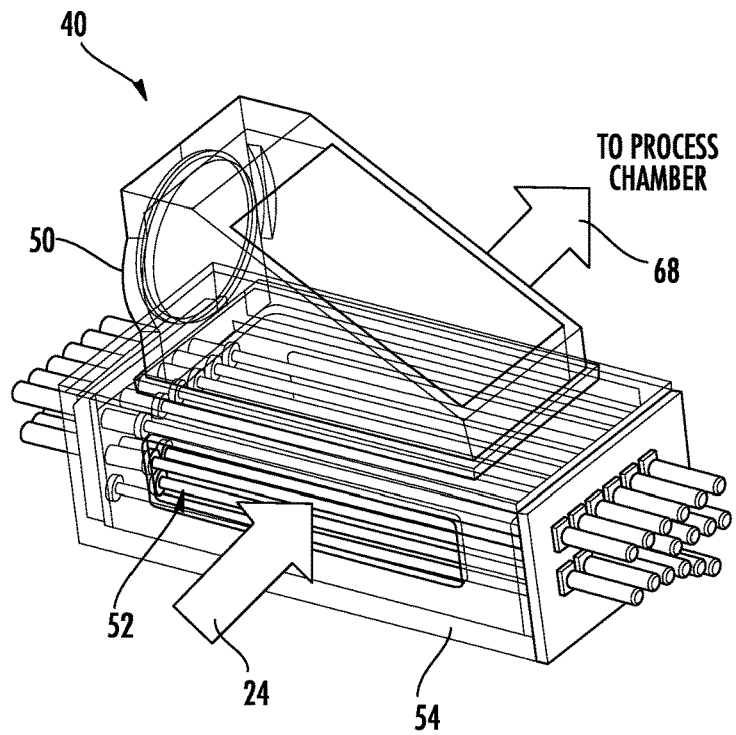
FIGS. 2A-B are semi-transparent isometric views illustrating a component of the ion implantation system shown in FIG. 1 in accordance with embodiments of the present disclosure.
Figure 2B:
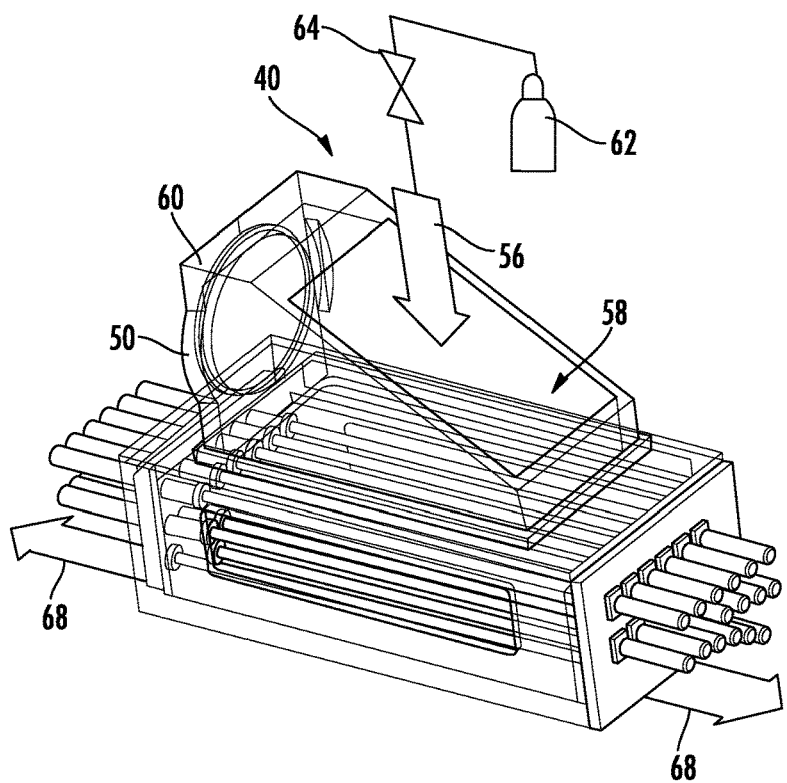

Referring now to FIGS. 2A-B, the EPM 40 according to exemplary embodiments will be described in greater detail. As shown, the EPM 40 includes an EPM chamber 50 extending above and partially encasing EPM 40. The EPM chamber 50 is operable to receive a gas and generate a plasma therein. In one embodiment, as shown in FIG. 2A, the EPM chamber 50 may receive a flow of the gas 24 (FIG. 1) from the ion source 14 at a gas inlet 52 through a sidewall 54. In another embodiment, as shown in FIG. 2B, the EPM chamber 50 may receive a flow of gas 56 at a gas inlet 58 through a top section 60 of the EPM chamber 50. The gas 56 may be supplied from a supplementary gas source 62 separate from the flow of gas 24 from the ion source 14. In an exemplary embodiment, an injection rate of the gas 56 into the EPM chamber 50 may be controlled by a flow controller 64 (e.g., a valve).

EPM 40 further operates with one or more vacuum pumps 66 (FIG. 1) to adjust a pressure of the EPM chamber 50. In exemplary embodiments, the vacuum pump 66 is coupled to the process chamber 46, and pressure is adjusted within the EPM chamber 50 through one or more flow paths 68. In another embodiment, the EPM 40 may include one or more additional pumps more directly coupled to the EPM chamber 50.

Figure 3:
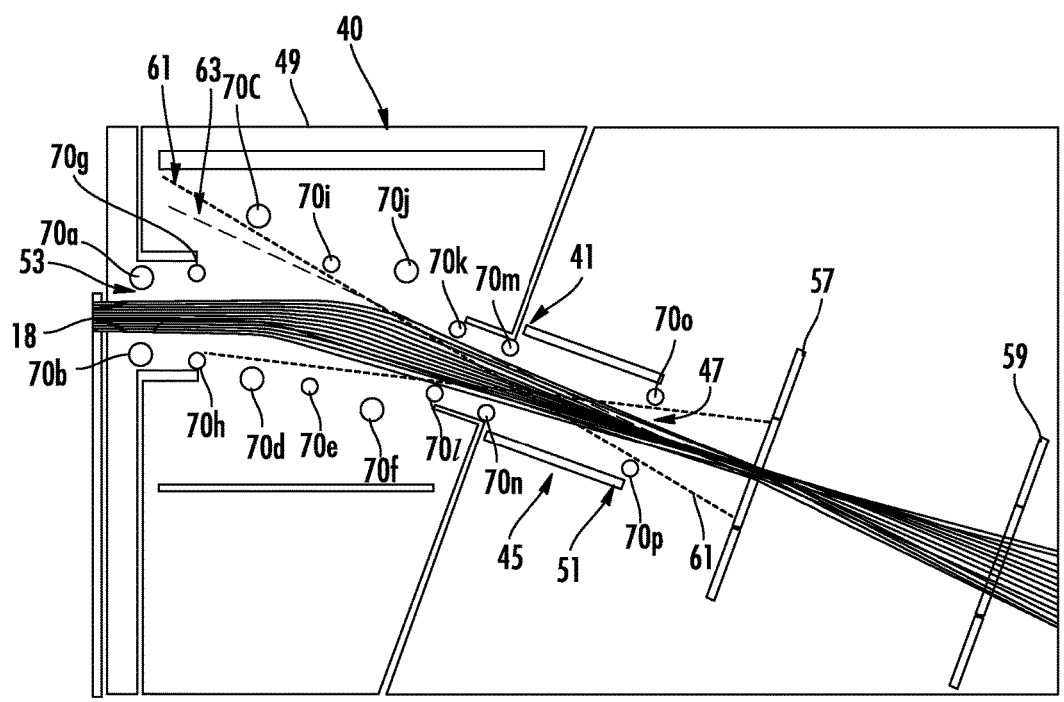
FIG. 3 is a side cross-sectional view illustrating the component of FIG. 2 in accordance with embodiments of the present disclosure.

Referring now to FIG. 3, an exemplary embodiment demonstrating the structure and operation of the EPM 40 in accordance with the present disclosure is shown. As shown, the EPM 40 may include a plurality of conductive beam optics 70A-P, such as a plurality of graphite electrode rods, disposed along opposite sides of the ion beam 18. The ion beam 18 is delivered through the EPM 40, entering at an entrance aperture 53 of a housing 49, and exiting at an exit 47 for impact with a wafer 57 and a dose cup 59. As shown, the plurality of conductive beam optics 70A-P provides a space/opening to allow the ion beam 18 (e.g., a ribbon beam) to pass therethrough. As described above, the vacuum pump 66 may be directly or indirectly connected to the housing 49 for adjusting a pressure of an environment therein.

In exemplary embodiments, the conductive beam optics 70A-P include pairs of conductive pieces electrically coupled to each other. Alternatively, the conductive beam optics 70A-P may be a series of unitary structures each including an aperture for the ion beam to pass therethrough. In the embodiment shown, upper and lower portions of each electrode pair may have different potentials (e.g., in separate conductive pieces) in order to deflect the ion beam passing therethrough. Although the plurality of conductive beam optics 70A-P are depicted as including sixteen (16) elements, a different number of elements (or electrodes) may be utilized. For example, the configuration of conductive beam optics 70A-P may utilize a range of three (3) to ten (10) electrode sets.

In one non-limiting embodiment, the conductive beam optics 70A-P may include a set of entrance aperture electrodes, or aperture terminals, 70A-B proximate the entrance aperture 53 of the housing 49. Downstream of the set of entrance aperture electrodes 70A-B is a set of energetic electrodes 70C-F. Between the set of entrance aperture electrodes 70A-B and the set of energetic electrodes 70C-F may be a set of terminal electrodes 70G-H. The plurality of conductive beam optics 70A-P may further include a set of ground electrodes 70I-P, wherein ground electrodes 70M, 70N, 70O, and 70P may represent a set of exit apertures positioned proximate the exit 47. As shown, the set of energetic electrodes 70C-F are positioned farther away from the ion beam 18 than the set of entrance aperture electrodes 70A-B and the set of ground electrodes 70I-P.

As further shown, the housing 49 may include a set of exit plates 45 extending therefrom. In some embodiments, the set of exit plates 45 are each oriented approximately parallel to a direction of travel of the ion beam 18. As shown, a first pair of exit apertures, such as ground electrodes 70O and 70P, is positioned proximate a downstream end 51 of the set of exit plates 45. A second pair of exit apertures, such as ground electrodes 70M and 70N, is positioned proximate an upstream end 41 of the set of exit plates 45. The first and second pairs of exit apertures are operable to deliver the ion beam 18 to the wafer 57, and to control material bouncing back from the wafer 57, along the direction of the ion beam 18 and into the EPM 40.

For example, during use, impact of the ion beam 18 on the wafer 57 generates material tending to travel upstream along the ion beam 18 and into the EPM 40. The set of exit apertures 70M-P define a maximum envelope 61 of back-sputter material and an actual envelope 63 of back-sputter material traveling from the wafer 57 and through the exit 47, between the set of exit apertures 70M-P. In some embodiments, the maximum envelope 61 is defined by an area within the EPM 40 between the exit apertures 70O and 70P, and between the ground electrodes 70K and 70L. The actual envelope 63 may be defined by upper and lower borders/edges of the ion beam 18, for example, proximate the exit 47 of the housing 49.

As shown, a position of the set of energetic electrodes 70C-F relative to the set of exit apertures 70M-P and the ground electrodes 70I, 70J, 70K, and 70L prevents both the maximum envelope 61 of back-sputter material and the actual envelope 63 of back-sputter material from reaching the set of energetic electrodes 70C-F. Said another way, the set of energetic electrodes 70C-F are positioned away from the ion beam 18 so as to be hidden or blocked behind the set of exit apertures 70M-P and the ground electrodes 70I, 70J, 70K, and 70L.

Figure 4:
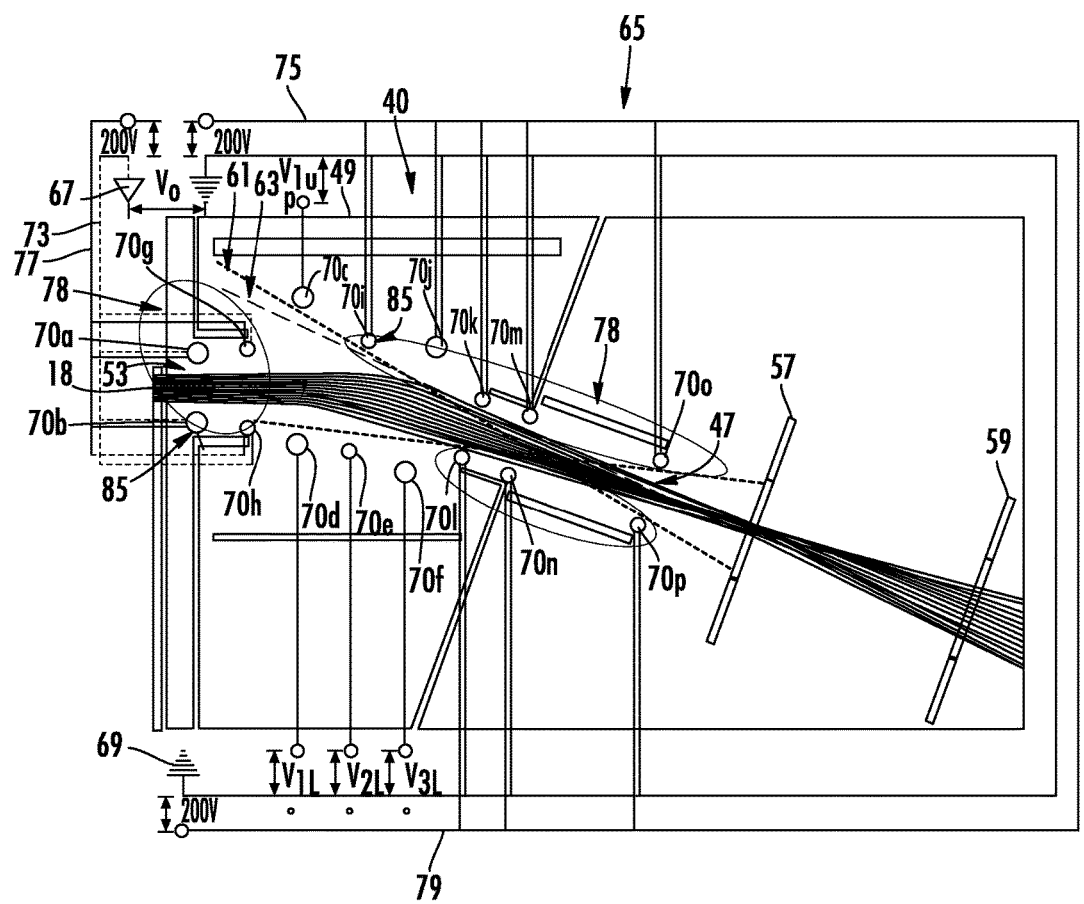
FIG. 4 is a side cross-sectional view illustrating the component of FIG. 3 operating with an electrical system in accordance with embodiments of the present disclosure.

Turning now to FIG. 4, an electrical system 65 in communication with the EPM 40 according to embodiments of the present disclosure will be described in greater detail. As shown, the electrical system 65 is operable to supply a voltage and a current to each of the plurality of conductive beam optics 70A-P. In some embodiments, the plurality of conductive beam optics 70A-P are each connected in parallel via the electrical system 65 to allow independent adjustment of voltage and current. In some embodiments, the electrical system 65 may include a first power source 67 (e.g., a terminal) and a second power source 69 (e.g., ground). The first power source 67 and the second power source 69 are operable to deliver a high voltage (e.g., 200V) to the plurality of conductive beam optics 70A-P. More specifically, the first power source 67 may be electrically connected with the set of entrance aperture electrodes 70A-B, and with the set of terminal electrodes 70G-H, via a first electrical path 73. Meanwhile, the second power source 69 may be connected with each of the set of energetic electrodes 70C-F, and with each of the set of ground electrodes 70I-P, via a second electrical path 75. Used herein, the term energetic electrodes refers to electrodes receiving the high voltage from either the first or second power sources 67, 69.

In some embodiments, at least one conductive beam optic of the plurality of conductive beam optics 70A-P includes an internal heating element operable to increase the temperature thereof. For example, an internal heating element 55 may be within one or more of the set of entrance aperture electrodes 70A-B and within one or more of the set of terminal electrodes 70G-H. An internal heating element 55 may also be within each of the set of ground electrodes 70I-P. As shown, the internal heating elements 55 may be powered via a third electrical path 77 and a fourth electrical path 79. In some embodiments, the internal heating element 55 may be a quartz heater lamp buried within each respective electrode to evaporate the solid back-sputter materials 78 into a gaseous form to be pumped out of the EPM 40.

In the non-limiting embodiment of FIG. 4, four (4) energetic electrodes 70C-F are provided. The energetic electrodes 70C-F are positioned so as to be "hidden" behind the set of ground electrodes 70I-P, thus preventing the energetic electrodes 70C-F from the splashing and coating of the back-sputter material within the maximum envelope 61 and/or the actual envelope 63. The back-sputter material is stopped and collected by the set of entrance aperture electrodes 70A-B, the set of terminal electrodes 70G-H, and the set of ground electrodes 70I-P. The heating element(s) buried within one or more of the set of entrance aperture electrodes 70A-B, the set of terminal electrodes 70G-H, and/or the set of ground electrodes 70I-P may evaporate the solid back-sputter material 78 into the gaseous form to be pumped out of the EPM 40.

In some embodiments, accumulation of the solid back-sputter material may be more severe, e.g., when carborane, $SiF_4$ or $GeF_4$ is used as the source material. To prevent excessive accumulation, the EPM 40 of the present disclosure may operate in two modes: a processing mode and a cleaning mode. During the processing mode, the EPM 40 may operate normally to process the ion beam 18. During the cleaning mode, the EPM 40 may be in situ cleaned. In one non-limiting embodiment, a second voltage and a second current may be supplied to the conductive beam optics 70A-P of the EPM 40. The conductive beam optics 70A-P may be electrically driven in parallel (e.g., individually) or in series to enable uniform and/or independent cleaning thereof. The second voltage and the second current may be supplied by the first power supply 67.

Figure 5:
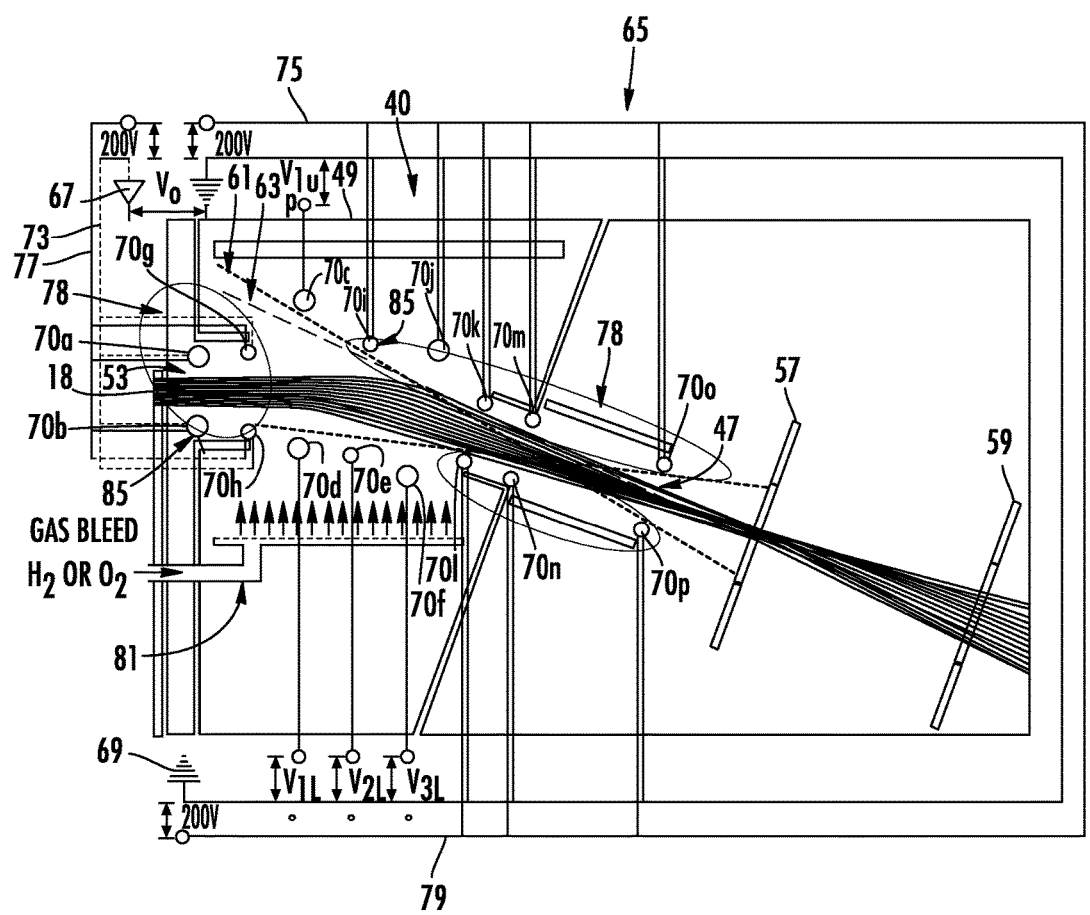
FIG. 5 is a side cross-sectional view illustrating the component of FIG. 3 operating with a gas supply in accordance with embodiments of the present disclosure.

Turning now to FIG. 5, the EPM 40 may be in situ cleaned during the cleaning mode. To accomplish the cleaning, an etchant gas (e.g., $H_2$ or $O_2$) may be introduced into the EPM 40 at a selected flow/injection rate from a gas supply component 81. In exemplary embodiments, the gas supply component 81 is a gas bleed device including a conduit having plurality of apertures formed therein to allow the etchant gas to be distributed within the EPM 40. For example, through the gas bleed device, 1 to 5 standard cubic centimeters per minute (SCCM) of gas such as $O_2$ or $H_2$ may be introduced into the EPM chamber. The gas chemically etches away the depositions of the back-sputter material 78 from the set of entrance aperture electrodes 70A-B, the set of terminal electrodes 70G-H, and the set of ground electrodes 70I-P. In other non-limiting examples, the etchant gas may be introduced at a flow rate of approximately 25 SCCM to approximately 200 SCCM. In one embodiment, the etchant gas may be introduced at approximately 50 SCCM to approximately 100 SCCM to maintain high pressure flow around the conductive beam optics 70A-P.

Various species may be introduced as the cleaning agent of the etchant gas. The cleaning agent may be atomic or molecular species containing chemically reactive species. Such species, when ionized, may chemically react with the deposits accumulated on one or more of the conductive beam optics 70A-P. Although a cleaning agent with chemically reactive species will be described herein, the present disclosure does not preclude utilizing chemically inert species. In another embodiment, the cleaning agent may contain heavy atomic species to form ions with high atomic mass units (amu) when ionized. Non-limiting examples of the cleaning agent may include atomic or molecular species containing H, He, N, O, F, Ne, Cl, Ar, Kr, and Xe, or a combination thereof. In one embodiment, $NF_3$, $O_2$, or a mixture of Ar and $F_2$, or a combination thereof, may be used as the cleaning agent.

The composition of the etchant gas can be chosen to optimize chemical etching based on a composition of the deposit(s) formed on the conductive beam optics 70A-P. For example, fluorine-based plasmas may be used to etch beam components containing B, P, and As, while oxygen-based plasmas may be used to etch photoresist materials. In one embodiment, adding Ar or other heavy species to the plasma mixture increases ion bombardment, resulting in an improved removal rate of the deposit(s) from the conductive beam optics 70A-P when using a chemically enhanced ion sputtering process. Plasma or ion bombardment also provokes heating of the surfaces to aid chemical etch rates and to help agitate the deposit(s) from the surface of the conductive beam optics 70A-P.

Figure 6:
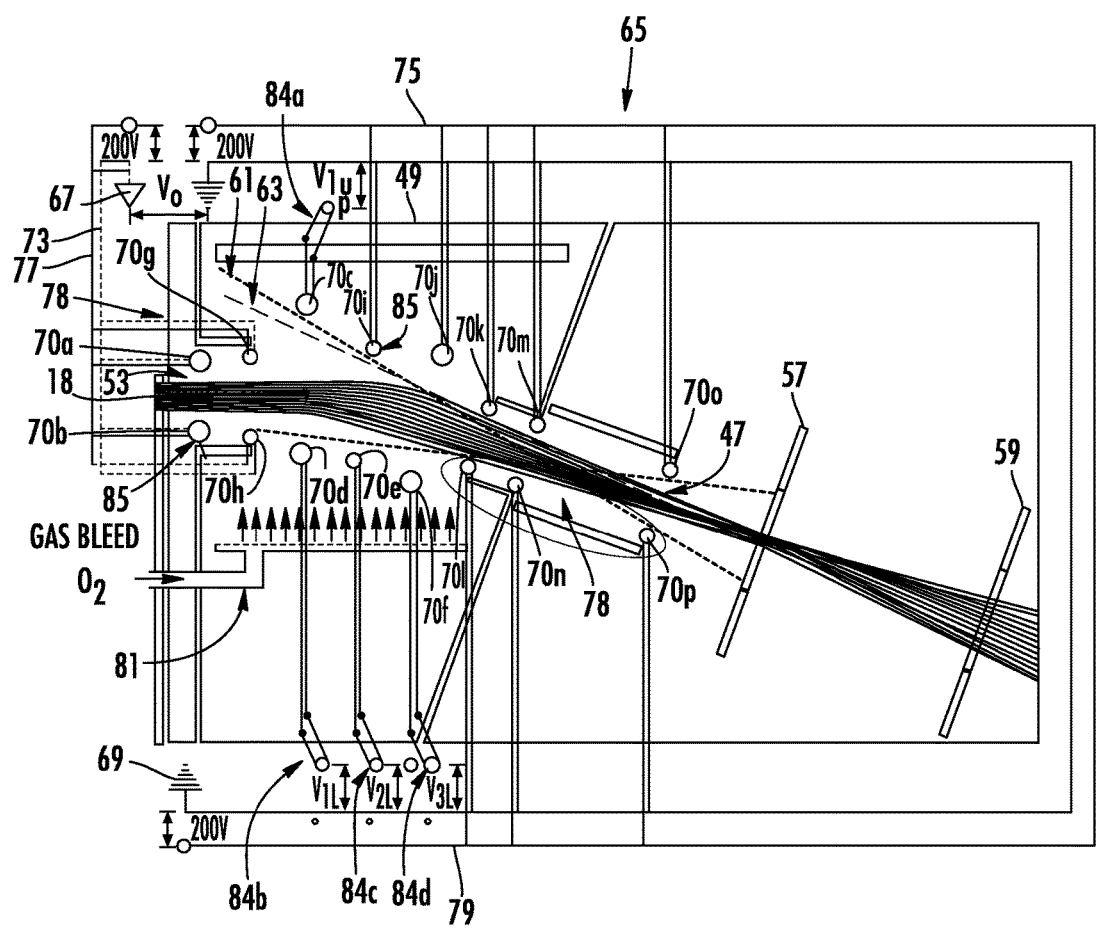
FIGS. 6-7 are side cross-sectional views illustrating the component of FIG. 3 operating with a set of relays in accordance with embodiments of the present disclosure.
Figure 7:
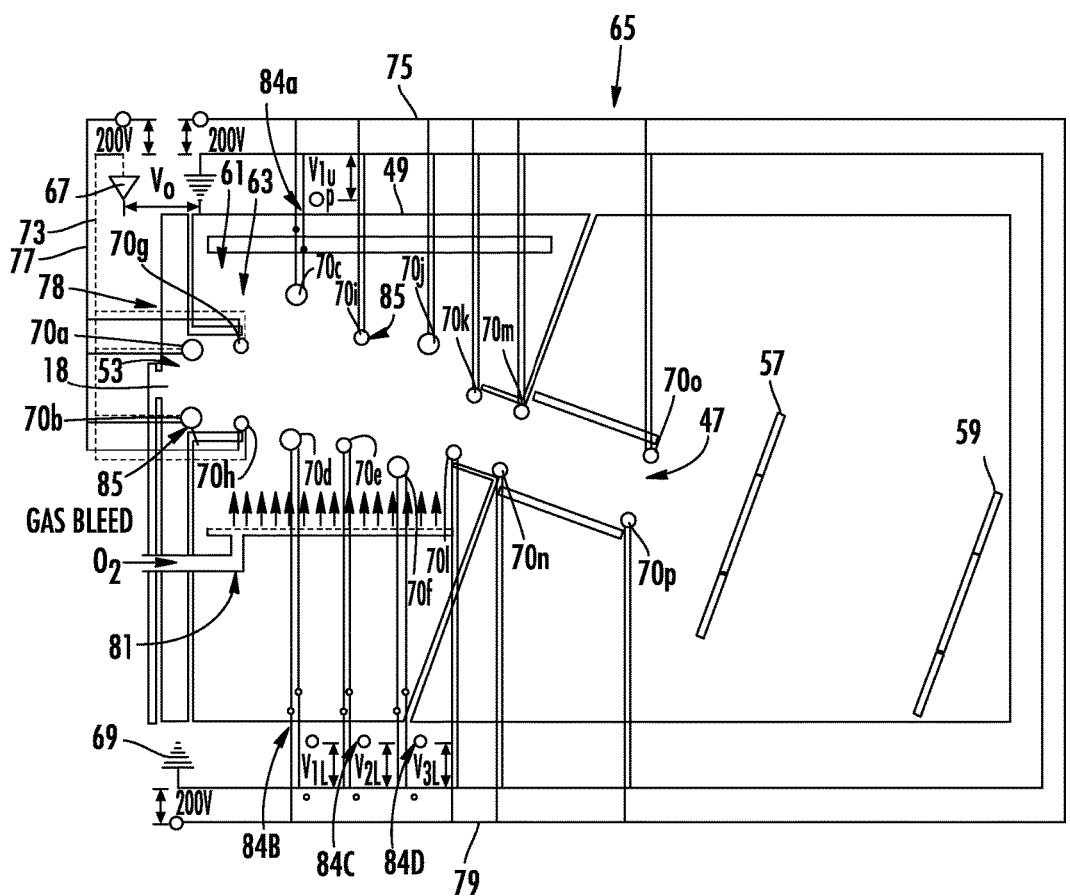

Turning now to FIGS. 6-7, operation of a set of relays 84A-D within the EPM 40 according to embodiments of the disclosure will be described in greater detail. As shown, the EPM 40 may include the set of relays 84A-D operable to switch each of the set of energetic electrodes 70C-F between the high voltage first power supply 67 and the second power supply 69 (ground). In the configuration shown, the energetic electrodes 70C-F may have internal heating elements 55 buried within. During an ion implantation, as depicted in FIG. 6, the energetic electrodes 70C-F are connected to the high voltage power supply 67, and internal heating elements 55 are turned OFF.

As depicted in FIG. 7, during beam setup, or during the period when the implanter is idle, the energetic electrodes 70C-F may be connected to the second power supply 69, and the internal heating elements 55 may be turned ON. In some embodiments, the energetic electrodes 70C-F are maintained above 200° C. during implantation to ensure the energetic electrodes 70C-F are free from the deposition due to condensation of the gaseous back-sputter materials. In situ cleaning and chemical etch from the gas supply component 81 within the EPM 40 keeps the energetic electrodes 70C-F and the exit apertures 70M, 70N, 70O, and 70P free from the deposition of the back-sputter materials. As a result, performance and accuracy of the ion implanter is improved.

Figure 8:
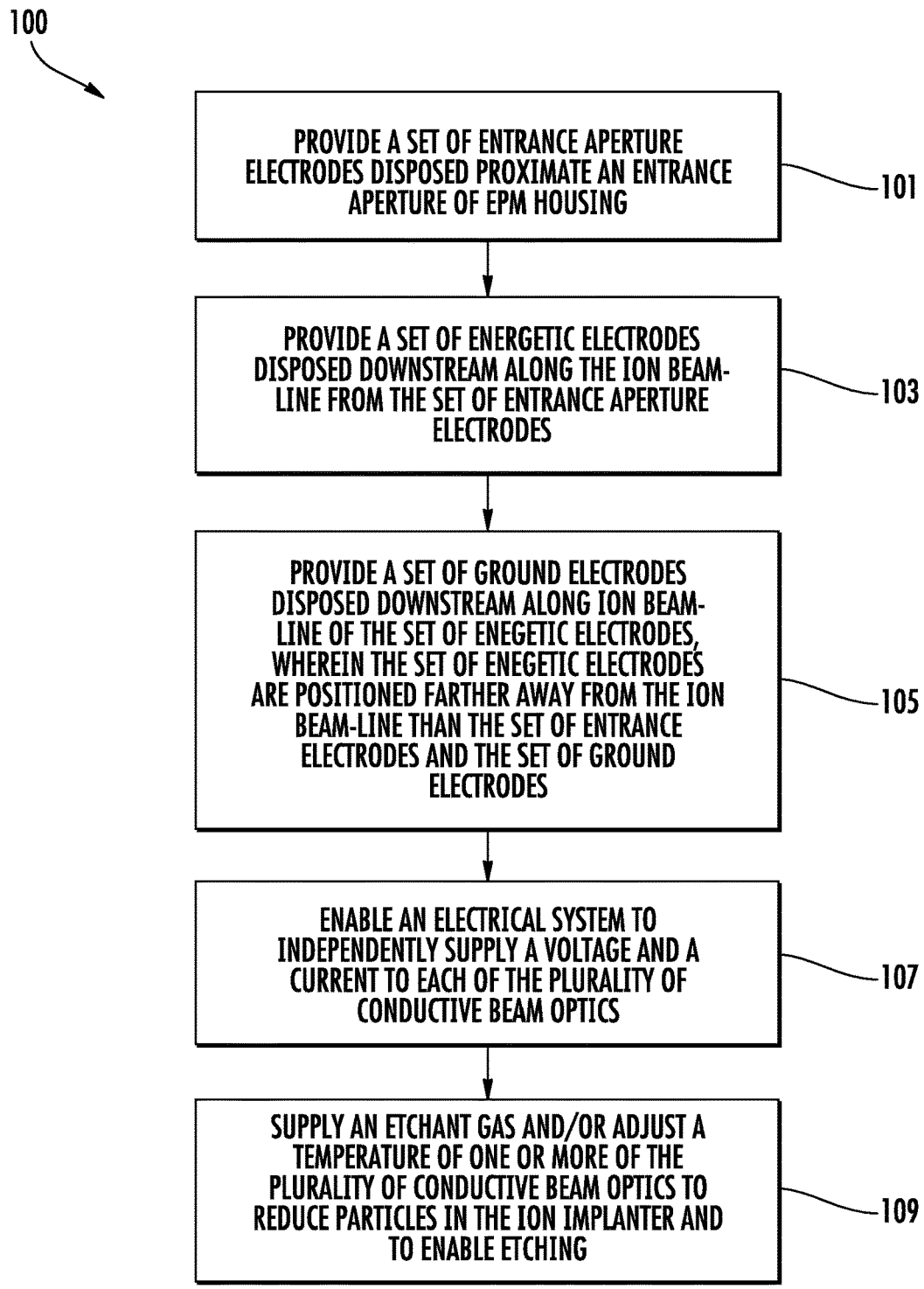
FIG. 8 is a flowchart illustrating an exemplary method in accordance with embodiments of the present disclosure.

Referring now to FIG. 8, a flow diagram illustrating a method 100 for reducing particles in an ion implanter in accordance with embodiments of the present disclosure is shown. The method 100 will be described in conjunction with the representations shown in FIGS. 1-7.

At block 101, the method 100 may include providing a set of entrance aperture electrodes disposed proximate an entrance aperture of a housing of the EPM. In some embodiments, the EPM includes a plurality of conductive beam optics, including the set of entrance aperture electrodes. In some embodiments, the plurality of conductive beam optics includes a plurality of electrode rods.

At block 103, the method 100 may include providing a set of energetic electrodes disposed downstream along the ion beam-line from the set of entrance aperture electrodes. At block 105, the method 100 may include providing a set of ground electrodes disposed downstream along the ion beam-line of the set of energetic electrodes, wherein the set of energetic electrodes is positioned farther away from the ion beam-line than the set of entrance aperture electrodes and the set of ground electrodes.

In some embodiments, block 105 of the method 100 may include providing a set of exit apertures of the set of ground electrodes proximate the exit, and providing a set of exit plates extending from the housing, wherein the set of exit apertures is oriented approximately parallel to the ion beam-line. Block 105 of the method 100 may further include positioning a first pair of exit apertures of the set of exit apertures proximate a downstream end of the set of exit plates, wherein a second pair of exit apertures of the set of exit apertures is positioned proximate an upstream end of the set of exit plates. The set of exit apertures may define an envelope of back-sputter material traveling from the wafer and then through the exit aperture.

At block 107, the method 100 may include enabling an electrical system to independently supply a voltage and a current to each of the plurality of conductive beam optics. In some embodiments, a first voltage and a first current is supplied to the plurality of conductive beam optics during a processing mode. In some embodiments, the first voltage and the first current are supplied by a direct current (DC) power supply. In some embodiments, the method 100 further includes switching from the processing mode to a cleaning mode. In some embodiments, block 107 includes automatically switching from the processing mode to the cleaning mode in the case a predetermined threshold is achieved, e.g., a maximum acceptable number of beam glitches.

During the cleaning mode, a second voltage and a second current may be supplied to the conductive beam optics. In some embodiments, the second voltage and the second current are applied the conductive beam optics to generate a plasma. In some embodiments, the second voltage and the second current are supplied from a direct current (DC) power supply or a radio frequency (RF) power supply.

At block 109, the method 100 may include supplying an etchant gas and/or adjusting a temperature of one or more of the plurality of conductive beam optics to reduce particles in the ion implanter and to enable etching. In some embodiments, an injection rate of the etchant gas is adjusted. In some embodiments, a composition of the etchant gas is selected to optimize etching of the component based on a composition of the deposit formed on a surface of the component. In some embodiments, at least one conductive beam optic of the plurality of conductive beam optics includes an internal heating element operable to increase a temperature thereof.

In view of the foregoing, at least the following advantages are achieved by the embodiments disclosed herein. In a first advantage, the EPM reduces particles by eliminating or greatly reducing deposition of the back-sputter materials onto the EPM electrodes and apertures, thus improving device yield and productivity of the ion implanter. In a second advantage, the EPM may include just four (4) energetic electrodes hidden behind the ground electrodes and apertures, thus preventing the energetic electrodes from the splashing and coating of the back-sputter material. The back-sputter materials are stopped and collected by the ground electrodes/apertures and the terminal electrodes/apertures. In a third advantage, one or more of the conductive beam optics may include a heater lamp buried within to evaporate the back-sputter material into gaseous form to be pumped out of the EPM. The self and in situ cleaning mechanism, in addition to the hidden energetic electrodes, helps to keep all the EPM electrodes and apertures free from the deposited back-sputter materials during the implanting.

While certain embodiments of the disclosure have been described herein, the disclosure is not limited thereto, as the disclosure is as broad in scope as the art will allow and the specification may be read likewise. Therefore, the above description is not to be construed as limiting. Those skilled in the art will envision other modifications within the scope and spirit of the claims appended hereto.

What is claimed is:

1. An ion implantation system, comprising:
   an electrostatic filter for delivering an ion beam to a wafer, the electrostatic filter comprising:
   a housing having an exit proximate the wafer; and
   a plurality of conductive beam optics within the housing, the plurality of conductive beam optics arranged around an ion beam-line, and the plurality of conductive beam optics comprising:
   a set of entrance aperture electrodes proximate an entrance aperture of the housing;
   a set of energetic electrodes downstream along the ion beam-line from the set of entrance aperture electrodes;
   a set of ground electrodes downstream along the ion beam-line of the set of energetic electrodes, wherein the set of energetic electrodes is positioned farther away from the ion beam-line than the set of entrance aperture electrodes and the set of ground electrodes; and
   a set of terminal electrodes positioned between the set of entrance aperture electrodes and the set of energetic electrodes; and
   an electrical system in communication with the electrostatic filter, the electrical system operable to supply a voltage and a current to the plurality of conductive beam optics.

2. The ion implantation system of claim 1, wherein each of the plurality of conductive beam optics is connected in parallel to allow independent adjustment of the voltage and the current.

3. The ion implantation system of claim 1, further comprising a set of exit plates extending from the housing, wherein the set of exit plates is oriented approximately parallel to a direction of travel of the ion beam.

4. The ion implantation system of claim 3, wherein the set of ground electrodes comprises a set of exit apertures proximate the exit.

5. The ion implantation system of claim 4, wherein the set of exit apertures define a maximum envelope of back-sputter material traveling from the wafer and through the exit, between the set of exit apertures.

6. The ion implantation system of claim 5, wherein a position of the set of energetic electrodes relative to the set of exit apertures prevents the maximum envelope of back-sputter material from reaching the set of energetic electrodes.

7. The ion implantation system of claim 4, wherein a first pair of exit apertures of the set of exit apertures is positioned proximate a downstream end of the set of exit plates, and wherein a second pair of exit apertures of the set of exit apertures is positioned proximate an upstream end of the set of exit plates.

8. The ion implantation system of claim 1, further comprising a set of relays operable to switch each of the set of energetic electrodes between a high voltage power supply and ground.

9. The ion implantation system of claim 1, wherein at least one conductive beam optic of the plurality of conductive beam optics comprises an internal heating element operable to increase a temperature of the at least one conductive beam optic.

10. An electrostatic filter for delivering an ion beam to a workpiece, the electrostatic filter comprising:
a housing having an exit proximate the workpiece; and
a plurality of conductive beam optics within the housing, the plurality of conductive beam optics comprising:
a set of entrance aperture electrodes proximate an entrance aperture of the housing;
a set of energetic electrodes downstream along an ion beam-line from the set of entrance aperture electrodes; and
a set of ground electrodes downstream along the ion beam-line of the set of energetic electrodes, wherein the set of energetic electrodes is positioned farther away from the ion beam-line than the set of entrance aperture electrodes and the set of ground electrodes;
a set of terminal electrodes positioned between the set of entrance aperture electrodes and the set of energetic electrodes; and
an electrical system in communication with the plurality of conductive beam optics.

11. The electrostatic filter of claim 10, further comprising:
a set of exit apertures of the set of ground electrodes positioned proximate the exit; and
a set of exit plates extending from the housing, wherein the set of exit plates is oriented approximately parallel to the ion beam-line, wherein a first pair of exit apertures of the set of exit apertures is positioned proximate a downstream end of the set of exit plates, and wherein a second pair of exit apertures of the set of exit apertures is positioned proximate an upstream end of the set of exit plates.

12. The electrostatic filter of claim 11, wherein the set of exit apertures defines a maximum envelope of back-sputter material traveling from the workpiece and through the exit, between the set of exit apertures, and wherein a position of the set of energetic electrodes relative to the set of exit apertures minimizes an amount of back-sputter material from reaching the set of energetic electrodes.

13. The electrostatic filter of claim 10, wherein each of the plurality of conductive beam optics is connected in parallel to allow independent adjustment of a voltage and a current supplied by the electrical system.

14. The electrostatic filter of claim 10, further comprising:
an internal heating element within each the set of energetic electrodes, the internal heating element operable to increase a temperature of each the set of energetic electrodes; and
a set of relays operable to switch the internal heating element within each the set of energetic electrodes between an ON configuration and an OFF configuration.

15. A method for minimizing particles in an ion implantation system, the method comprising:
arranging a plurality of conductive beam optics arranged around an ion beam-line, wherein the plurality of conductive beam optics comprises:
a set of entrance aperture electrodes disposed proximate an entrance aperture of the housing;
a set of energetic electrodes disposed downstream along the ion beam-line from the set of entrance aperture electrodes;
a set of ground electrodes disposed downstream along the ion beam-line of the set of energetic electrodes, wherein the set of energetic electrodes is positioned farther away from the ion beam-line than the set of entrance aperture electrodes and the set of ground electrodes; and
a set of terminal electrodes positioned between the set of entrance aperture electrodes and the set of energetic electrodes; and
enabling an electrical system to independently supply a voltage and a current to the plurality of conductive beam optics.

16. The method of claim 15, further comprising connecting each of the plurality of conductive beam optics in parallel to allow independent adjustment of the voltage and the current.

17. The method of claim 15, further comprising:
providing a set of exit apertures of the set of ground electrodes proximate the exit; and
providing a set of exit plates extending from the housing, wherein the set of exit apertures is oriented approximately parallel to the ion beam-line, wherein a first pair of exit apertures of the set of exit apertures is positioned proximate a downstream end of the set of exit plates, wherein a second pair of exit apertures of the set of exit apertures is positioned proximate an upstream end of the set of exit plates, and wherein the set of exit apertures defines a maximum envelope of back-sputter material traveling from a wafer and through the exit aperture.

18. The method of claim 15, further comprising:
adjusting a temperature of at least one of the plurality of conductive beam optics using an internal heating element; and providing a set of relays operable to switch the internal heating element between an ON configuration and an OFF configuration.

\* \* \* \* \*